United States Patent
Ishii et al.

(10) Patent No.: US 9,577,014 B2
(45) Date of Patent: Feb. 21, 2017

(54) MANUFACTURING METHOD OF AN ORGANIC ELECTROLUMINESCENCE DISPLAY DEVICE AND THE ORGANIC ELECTROLUMINESCENCE DISPLAY DEVICE

(71) Applicant: Japan Display Inc., Tokyo (JP)

(72) Inventors: Yoshinori Ishii, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/657,363

(22) Filed: Mar. 13, 2015

(65) Prior Publication Data

US 2015/0270319 A1  Sep. 24, 2015

(30) Foreign Application Priority Data

Mar. 20, 2014  (JP) .................................. 2014-057990

(51) Int. Cl.
| | |
|---|---|
| H01L 29/08 | (2006.01) |
| H01L 27/32 | (2006.01) |
| H01L 51/52 | (2006.01) |

(52) U.S. Cl.
CPC ......... *H01L 27/3246* (2013.01); *H01L 27/322* (2013.01); *H01L 51/5284* (2013.01)

(58) Field of Classification Search
CPC ........... H01L 27/32; H01L 51/52; H01L 51/56
USPC .............................................. 257/40; 438/29
See application file for complete search history.

(56) References Cited

U.S. PATENT DOCUMENTS

| | | | | |
|---|---|---|---|---|
| 5,631,753 | A * | 5/1997 | Hamaguchi ....... | G02F 1/133512 257/E31.122 |
| 6,897,923 | B2 * | 5/2005 | Kanesaka ......... | G02F 1/133553 349/113 |
| 9,024,525 | B2 * | 5/2015 | Furuie .................. | H01L 51/5284 313/503 |
| 9,093,327 | B2 * | 7/2015 | Koresawa ........... | H01L 27/3274 |
| 2005/0121669 | A1 * | 6/2005 | Kobayashi ............ | H01L 27/322 257/40 |
| 2007/0114521 | A1 * | 5/2007 | Hayashi .............. | H01L 51/5237 257/40 |
| 2007/0123135 | A1 | 5/2007 | Yang et al. | |
| 2010/0059754 | A1 * | 3/2010 | Lee ........................ | H01L 27/322 257/59 |
| 2011/0037068 | A1 * | 2/2011 | Yamazaki ........... | H01L 27/1225 257/43 |
| 2011/0073885 | A1 * | 3/2011 | Kim .................... | H01L 27/3211 257/89 |

(Continued)

FOREIGN PATENT DOCUMENTS

| | | |
|---|---|---|
| JP | 2007-033928 A | 2/2007 |
| JP | 2007-149693 A | 6/2007 |

*Primary Examiner* — Caleb Henry
(74) *Attorney, Agent, or Firm* — TYPHA IP LLC

(57) ABSTRACT

A manufacturing method of an organic electroluminescence display device including a device substrate provided with a plurality of pixel electrodes which have a gap part therebetween, a common electrode disposed opposite to the plurality of pixel electrodes, a light emitting layer provided over the plurality of pixel electrodes, and a bank layer provided in the gap part of the plurality of pixel electrodes, the method comprising forming a cover layer including a concave region to fit into a convex shaped part of the bank layer at a support substrate, forming a color filter layer facing the pixel electrode to the concave region, disposing a surface of the color filter layer on the device substrate so that the concave region fits into a convex shaped part, and attaching the cover layer and the color filter layer on the device substrate by peeling the cover layer from the support substrate.

15 Claims, 13 Drawing Sheets

(56) References Cited

U.S. PATENT DOCUMENTS

| | | | |
|---|---|---|---|
| 2013/0015450 A1* | 1/2013 | Kim | H01L 51/5275 257/59 |
| 2013/0153870 A1* | 6/2013 | Seo | H01L 51/5275 257/40 |
| 2014/0021457 A1* | 1/2014 | Ukeda | H01L 27/3274 257/40 |
| 2014/0077182 A1* | 3/2014 | Kim | H01L 51/0005 257/40 |
| 2014/0117342 A1* | 5/2014 | Kwon | H01L 27/3244 257/40 |
| 2014/0134763 A1* | 5/2014 | Park | H01L 51/0014 438/26 |
| 2014/0151709 A1* | 6/2014 | Nishiyama | H01L 27/3211 257/72 |
| 2014/0159026 A1* | 6/2014 | Okumoto | H01L 29/786 257/40 |
| 2014/0284572 A1* | 9/2014 | Oooka | H01L 51/525 257/40 |
| 2014/0339509 A1* | 11/2014 | Choi | H01L 51/5275 257/40 |
| 2015/0021559 A1* | 1/2015 | Han | H01L 51/524 257/40 |
| 2015/0228703 A1* | 8/2015 | Yamazaki | H01L 21/28114 257/40 |
| 2015/0233557 A1* | 8/2015 | Aoyama | F21S 4/005 362/183 |
| 2015/0236167 A1* | 8/2015 | Yamazaki | H01L 29/7869 257/43 |
| 2015/0270319 A1* | 9/2015 | Ishii | H01L 27/3246 257/40 |

* cited by examiner

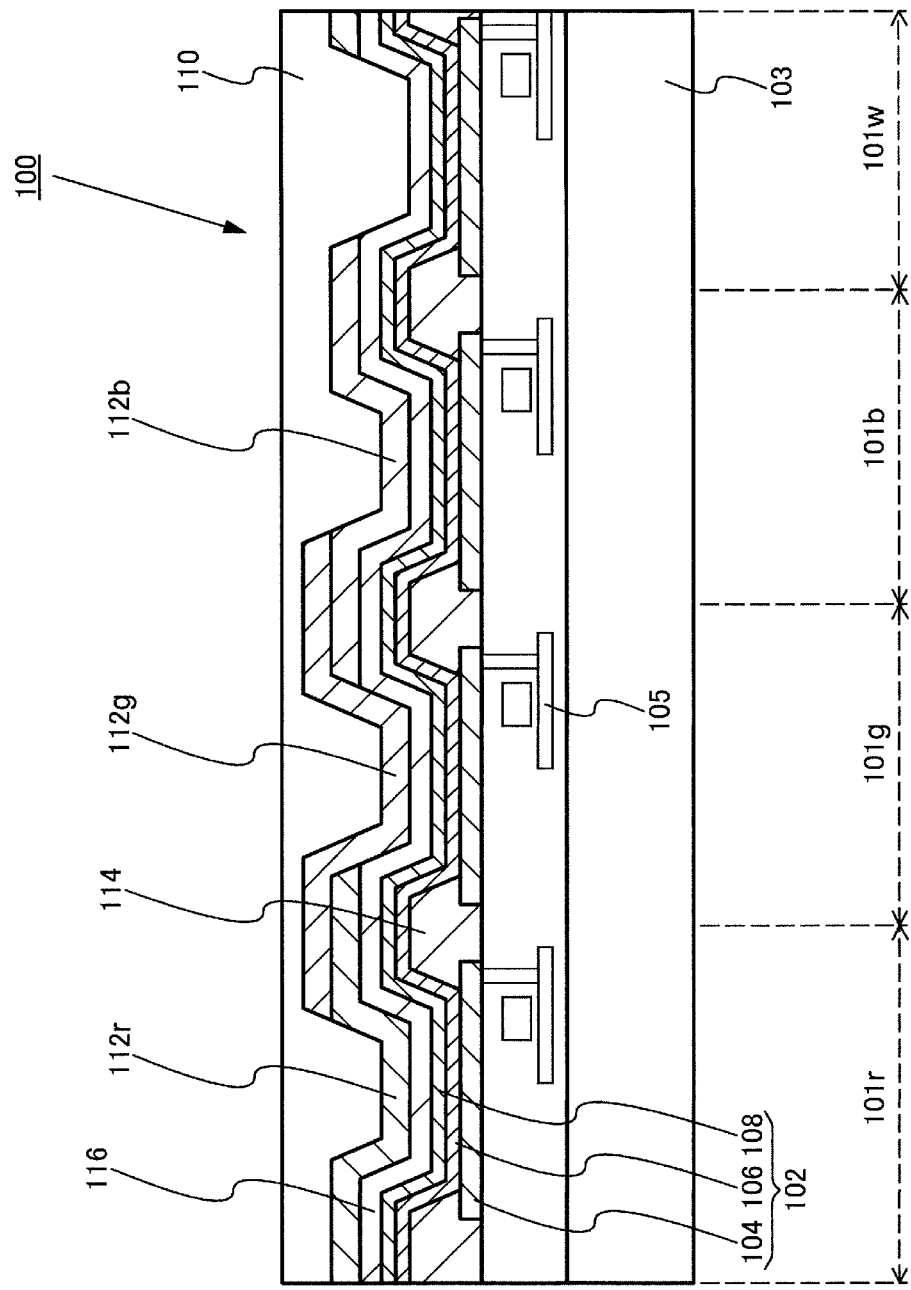

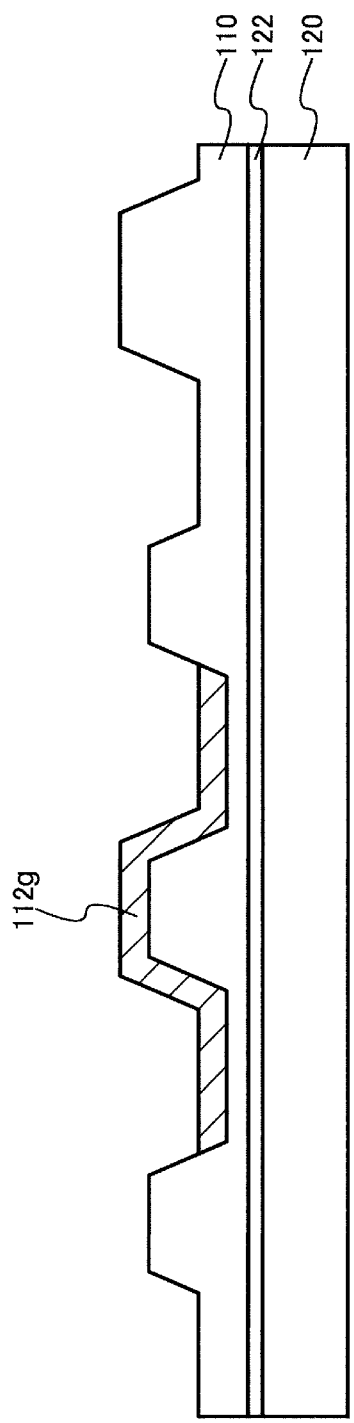

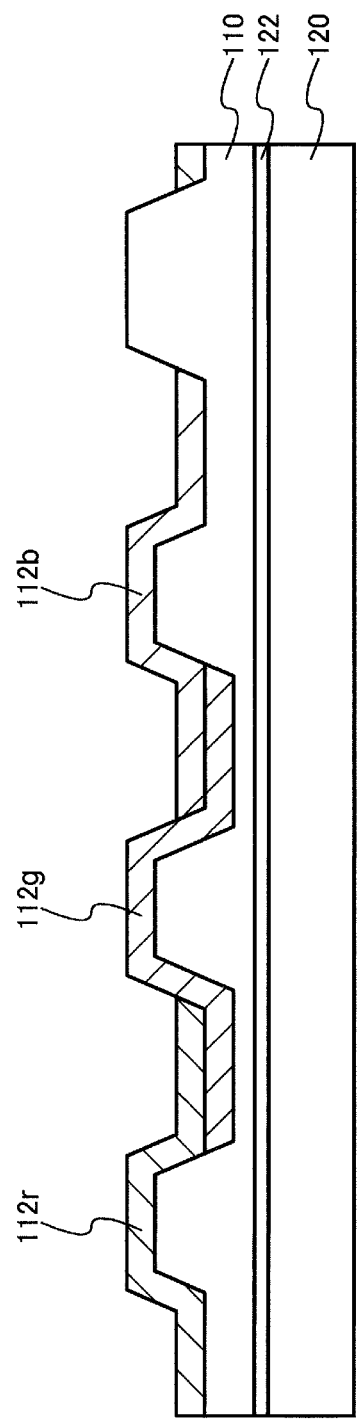

MANUFACTURING METHOD OF AN ORGANIC ELECTROLUMINESCENCE DISPLAY DEVICE AND THE ORGANIC ELECTROLUMINESCENCE DISPLAY DEVICE

CROSS REFERENCE TO RELATED APPLICATIONS

This application is based upon and claims the benefit of priority from the prior Japanese Patent Application No. 2014-057990, filed on Mar. 20, 2014, the entire contents of which are incorporated herein by reference.

FIELD

The present invention is related to a structure of a pixel region in an electroluminescence display device.

BACKGROUND

Although high functionality electronic terminal devices represented by smartphones or tablets have a small screen size compared to televisions or personal computer monitors, high definition screens with a pixel density of 300 ppi are progressing. The light emitted from each pixel is split into red (R), green (G) and blue (B) and in what is called a color-separation type organic electroluminescence display device, it is difficult to separate colors of a light emitting layer for each pixel by miniaturizing pixels and reducing the pixel pitch. As a result, in a color-separation method for splitting light emitting layers of an organic electroluminescence device for each color emitted, it has been pointed out that high resolution of a pixel is difficult. A light emitting layer of an organic electroluminescence device is generally formed using a vapor deposition method or printing method and it is thought that because an organic material for forming the light emitting layer is weak to chemical solvents, this is one cause of it not being suitable for miniaturization processing by photolithography.

However, because an organic electroluminescence display device combining an organic electroluminescence device which appears to emit white light artificially across a wide band of the visible light emitting spectrum does not require splitting light emitting layers for each pixel, it is thought to be advantageous for achieving high resolution. That is, in the case where an organic electroluminescence device emits white light, it is sufficient to create the organic electroluminescence device using the same layer manufacturing process for the same surface of a pixel region and because the light which is emitted from each pixel can be adjusted just be using a color filter, it is easier to achieve miniaturization of a pixel during manufacture.

An organic electroluminescence display device in which a color adjustment layer is provided using a transfer printing method (laser transfer printing method) on the light emitting surface of an organic electroluminescence device is disclosed in Japanese Laid Open Patent No. 2007-149693 as an example of combining a white light emitting organic electroluminescence device and a color filter. A method of printing a transfer layer by arranging a plurality of color filters onto an intermediate transfer sheet, heating the transfer layer using a thermal head and transferring to a transparent substrate is disclosed in Japanese Laid Open Patent No. 2007-033928.

SUMMARY

According to one embodiment of the present invention, a manufacturing method of an organic electroluminescence display device including a device substrate provided with a plurality of pixel electrodes which have a gap part therebetween, a common electrode disposed opposite to the plurality of pixel electrodes, A light emitting layer provided between the common electrode and the plurality of pixel electrodes, a bank layer protruding from the pixel electrode in the gap part of the plurality of pixel electrodes, the method comprising forming a cover layer including a concave region to fit into a convex shaped part of the bank layer at a support substrate, forming a color filter layer from a region of the cover layer facing the pixel electrode to the concave region, disposing a surface of the color filter layer of the support substrate on the device substrate so that the concave region fits into a convex shaped part, and attaching the cover layer and the color filter layer on the device substrate by peeling the cover layer from the support substrate.

According to one embodiment of the present invention, an organic electroluminescence display device is provide including a substrate provided with a plurality of pixels, a plurality of pixel electrodes formed on the substrate, each of the pixel electrodes being formed in each of the pixels, a bank layer located in an gap part between the plurality of pixels and exposing the pixel electrode, a light emitting layer located on an opposite side to the substrate of the pixel electrode, a common electrode located on an opposite side to the substrate of the light emitting layer and provided over the plurality of pixels and the bank layer, a color filter layer located on an opposite side to the substrate of the common electrode and provided over the bank layer and one of the plurality of pixels, and a cover layer located on an opposite side to the substrate of the color filter and provided over the plurality of pixels and the bank layer.

According to one embodiment of the present invention, an organic electroluminescence display device is provided including a substrate provided with a plurality of pixels, a plurality of pixel electrodes formed on the substrate, each of the pixel electrodes being formed in each of the pixels, a bank layer positioned in an gap part between the plurality of pixels and exposing the pixel electrode, a light emitting layer positioned on an opposite side to the substrate of the pixel electrode, a common electrode positioned on an opposite side to the substrate of the light emitting layer and provided over the plurality of pixels and the bank layer, and a color filter layer positioned on an opposite side to the substrate of the common electrode and provided over the bank layer and one of the plurality of pixels, wherein each of the plurality of pixel electrodes includes an exposure area exposed by the bank layer, and the color filter layer includes a convex part protruding towards the substrate at a position facing the exposure area.

BRIEF DESCRIPTION OF THE DRAWINGS

FIG. 1 is a cross-sectional diagram showing a structure of an organic electroluminescence display device related to one embodiment of the present invention;

FIG. 2A~2C are cross-sectional diagrams explaining a manufacturing process of an organic electroluminescence display device related to one embodiment of the present invention;

DESCRIPTION OF EMBODIMENTS

Figure 2A:
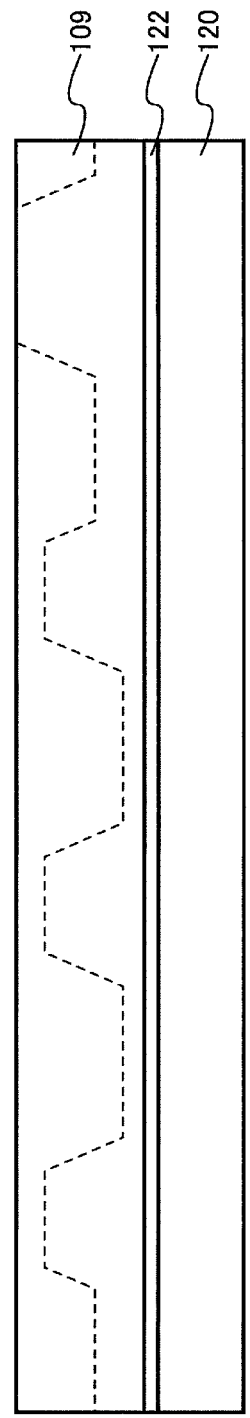

The embodiments of the present invention are explained below while referring to the diagrams. However, the present invention can be realized by various different forms and should not be interpreted as being limited to the contents described in the embodiments exemplified below. In addition, although the width, thickness and shape of each part are sometimes displayed schematically compared to the actual form in the diagrams in order to clarify the explanation, these are just examples and should not limit the interpretation of the present invention. In addition, in the present specification and diagrams, the same symbols are applied to the same elements described previously in the diagrams and a detailed explanation is sometimes omitted where appropriate.

An organic electroluminescence display device includes excellent visual angle characteristics compared to a liquid crystal display device. However, when the distance between an organic electroluminescence device (light emitting part) and color filter layer is separate, a problem occurs where the visual angle characteristics drop. That is, the more the display screen is seen from a frontal angle, the greater the deterioration in tone, brightness and contrast. Although there are various causes of this deterioration, it is thought that mixed colors due to light leaking to an adjacent pixel from a light emitting pixel is one cause. When a pixel is miniaturized, because the interval between adjacent pixels becomes narrower, the problem of mixed colors becomes more apparent.

An organic electroluminescence display device is provided with an insulation layer called a bank layer which encloses a pixel electrode in a pixel region. The bank layer covers a contact between a periphery end part of a pixel electrode and a wire, the remaining area of the pixel area is open and the bank layer protrudes from that pixel electrode. As a result, it is difficult to create a color filter along concave-convex shaped surface of the bank layer using the thermal transfer method disclosed in Japanese Laid Open Patent No. 2007-033928. The organic electroluminescence display device disclosed in Japanese Laid Open Patent No. 2007-149693 is created with color filter using a laser thermal transfer method. In addition, the color filter layer is formed above a protection film which is planarized and concave-convex parts are buried via the bank layer.

However, in a structure in which a color filter is provided above a protection film including a thickness sufficient to bury a bank layer, there is a limit to bringing the color filter layer and an organic electroluminescence close together. This is because a planarized protection film which is buried with a bank layer requires a thickness more than the height of which the bank layer protrudes. Consequently, according to the conventional technology, even when attempting to make the interval between a color filter layer and organic electroluminescence device narrower, there is a problem whereby the surface can not be brought closer than the thickness of the planarized protection film.

Eventually, in the case where the interval between a color filter layer and a white light organic electroluminescence device is wide, since light leaking from a light emitting pixel to an adjacent pixel and mixed colors as a result can not be ignored, there is a problem in an organic electroluminescence display device with this structure whereby there is a limit to how much the visual angle characteristics can be improved. Since this problem becomes more apparent the greater the resolution and the more the pixel size are reduced, it is important to solve this problem.

An organic electroluminescence display device in which visual angle characteristics can be improved is explained below as one embodiment of the present invention.

First Embodiment

Organic Electroluminescence Display Device

The structure of an organic electroluminescence display device 100 related to one embodiment of the present invention is shown in FIG. 1. The organic electroluminescence display device 100 exemplified in FIG. 1 is provided with an organic electroluminescence device 102 which emits white light in each pixel and a color filter with a different transmission spectrum is provided in each pixel.

In FIG. 1, pixel 101r is a red (R) pixel and an organic electroluminescence device 102 and a red color filter layer 112r are combined. Similarly, an organic electroluminescence device 102 and a green color filter layer 112g are combined in a green (G) pixel 101g, and an organic electroluminescence device 102 and a blue color filter layer 112b are combined in a blue (B) pixel 101b. Furthermore, a color filter layer does not have to be provided or a white (W) pixel 101w provided with a gradation layer with a wide transmission band may also be provided.

An organic electroluminescence device 102 includes a structure in which a pixel electrode 104, organic electroluminescence layer 106 and common electrode 108 are stacked. A pixel electrode 104 is provided in each pixel and is connected to a transistor 105 which controls the light emitted from a pixel. An organic electroluminescence layer 106 and common electrode 108 are provided in common across a plurality of pixels. Furthermore, it is preferred a sealing layer 116 which is formed from an insulation material such as silicon nitride is provided above the organic electroluminescence device 102. A bank layer 114 is provided so as to cover a periphery end part of the pixel electrode 104 and is provided so as to bury the interval between adjacent pixel electrodes.

In the present embodiment, there is no particular limitation to the structure of the organic electroluminescence layer 106. The organic electroluminescence layer 106 can be formed using either a low molecular or high molecular organic material. For example, in the case where a low molecular organic material is used for the organic electroluminescence layer 106, in addition to a light emitting layer including an organic material with light emitting properties, a carrier transport layer such as a hole transport layer or electron transport layer may be added so as sandwich the light emitting layers. In the present embodiment, the organic electroluminescence device 102 is applied with a white light emitting device which emits light in a wide band in the visible frequency range. The white light emitting organic electroluminescence device 102 has a structure including a light emitting layer which emits each color red (R), green (G) and blue (B) in the organic electroluminescence layer 106. Alternatively, it is possible to emit white light by adopting a structure including a light emitting layer which emits blue (b) and yellow (Y).

In the organic electroluminescence device 102, the organic electroluminescence layer 106, common electrode 108 and sealing film 116 are provided with a thickness of about 100 nanometers to a few hundred nanometers. For example, the organic electroluminescence layer 106 has a thickness of about 100 nm. However, the bank layer 114 is provided with a thickness from 1 micrometer to 2 micrometers or more. The organic electroluminescence layer 106, common electrode 108 and sealing film 116 are provided along a side wall surface and upper surface of the bank layer 114 from the upper surface of the pixel electrode 104. Since the thickness of the organic electroluminescence layer 106, common electrode 108 and sealing film 116 together does not add up to 1 micrometer, a pixel region in which the organic electroluminescence 102 is provided includes a concave-convex formed surface shape reflecting the shape of the bank layer.

The red color filter layer 112r is provided along a concave-convex shaped surface formed by the bank layer 114. That is, the red color filter layer 112r is provided along a step structure from an upper part of the pixel electrode 104 not provided with the bank layer 114 to the upper surface of the bank layer 114. Although the organic electroluminescence layer 106, common electrode 108 and sealing film 116 are stacked above the pixel electrode 104 and bank layer 114, it is preferred that the red color filter layer 112r is provided so at least one part contacts the sealing film 116. In the case where the sealing film 116 is omitted, at least one contacts the common electrode 108. Furthermore, the green color filter layer 112g and blue color filter layer 112b are the same.

Although FIG. 1 shows a structure in which a red color pixel 101r, green color pixel 101g and blue color pixel 101b are aligned, in the case where color filter layers having different transmission spectrums are provided adjacent to each other, it is preferred that pairs of adjacent color filters are stacked in an upper region of the bank layer 114. In FIG. 1, in the case where the red color filter 101r and green color filter 101g are adjacent, the red color filter layer 112r and green color filter layer 112g are shown as overlapping in a region which includes the bank layer 114. Similarly, a structure is shown in which the green color filter layer 112g and the blue color filter layer 112b are stacked in a region in which the green color pixel 101g and blue color pixel 101b are adjacent.

In this way, because the band of visible light which passes through this stacked layer region becomes narrow by overlapping color filter layers with different transmission spectrums, it is possible to reveal the function of a light blocking film. That is, because the light transmission ratio off a stacked color filter region becomes smaller by overlapping two or more color filter layers with different transmission spectrums, it is possible to reveal a similar function as a light blocking film. In other words, it is possible to omit a light blocking film by overlapping two or more color filter layers with different transmission spectrums.

A cover layer 110 is provided above the color filters 112r, 112g and 112b. The cover layer 110 is provided so that a step is buried in the color filter layers 112r, 112g and 112g and the surface is roughly flat. For example, although a concave-convex shape is emphasized because a region in which the red color filter layer 112r and green color filter layer 112g are stacked above the bank layer 114 has a thickness of two color filter layers, the cover layer 110 has a different thickness above the pixel electrode 104 and above the bank layer 114 and the surface of the cover layer 110 is formed so as to be flatter than the surface of a color filter layer.

The cover layer 110 has a function for protecting the surface of the organic electroluminescence display device. In addition, a function for burying the color filter layers 112r, 112g and 112b formed along the concave-convex surface formed by the bank layer 114 so that the surface of the pixel region is planarized is also provided.

The organic electroluminescence display device related to one embodiment of the present invention can reduce the interval between the color filter layers 112r, 112g, 112b and the organic electroluminescence device 102 by bringing them closer together. That is, because a space or filler material or a few micrometers or more is not present between the organic electroluminescence device and color filter layer, it is possible to narrow the interval between a device substrate and opposing substrate (cover layer). In this way, it is possible to reduce the thickness of the organic electroluminescence display device.

In this way, according to one embodiment of the present invention, it is possible to significantly reduce light leaking to an adjacent pixel by bring an organic electroluminescence device and cover layer closer together. Therefore, it is possible to solve the problem of mixed colors between adjacent pixels or between close pixels and improve visual angle characteristics.

Furthermore, it is possible to effectively use light emitted by an organic electroluminescence device by providing the cover layer 110 with a dispersion component. In addition, it is possible to provide external light reflection prevention effects by providing the cover layer 110 with a circular polarization plate function.

(Manufacturing Method of an Organic Electroluminescence Display Device)

Next, an example of a manufacturing method of this type of organic electroluminescence display device is explained using FIG. 2A to FIG. 2C and FIG. 3.

As is shown in FIG. 2A, a resin layer 109 is formed above a support substrate 120. Since the resin layer 109 is positioned on the side in which light is emitted from a pixel in the organic electroluminescence display device, it is preferred that a resin material is formed with translucency properties. Although the support substrate 120 is a hard substrate such as glass, a flexible thin material may be used such as a plastic film. In addition, a peeling layer 122 for peeling the resin layer formed in a later process from the support substrate 120 may be provided between the support substrate 120 and the resin layer 109.

An arbitrary material can be used within a range suitable for its purpose for the peeling layer 122. For example, it is preferred that a material that can peel the cover layer 110 from the support substrate 120 by a heating process or etching process is used as the peeling layer 122. It is possible to use polyimide from among organic resin materials as an example of the peeling layer 122. In addition, it is also possible to use an amorphous silicon including hydrogen as an inorganic material as the peeling layer 122. When these peeling layers 122 are heated by irradiating a laser beam, the adhesive between the support substrate 120 and peeling layer 122 drops and it becomes possible to peel the cover layer 110 from the support substrate.

As is shown in FIG. 2B, the resin layer 109 is formed in the same shape as the bank layer in the device substrate 103 so that a concave region is formed in a part where the bank layer 114 is present to form the cover layer 110. The thin region of the cover layer 110 is the region corresponding to the bank layer of the device substrate and the thick region corresponds to a pixel electrode. The cover layer 110 which includes regions having different thicknesses can be formed by molding the resin layer 109. Molding the resin layer 109 can be performed by forming a mask above the resin layer 109 by photolithography and performing etching so that a concave region is formed. In addition, a concave region may be formed from the resin layer 109 using a nano-imprint. Alternatively, the cover layer 110 may be manufactured by performing a photosensitive and exposure process so that the thickness of the part which becomes the concave region becomes thin using a photosensitive organic material as the resin layer 109.

Since the concave region in the cover layer 110 may also be a region in which color filter layers overlap, it is preferred that not only the height of the bank layer but also the depth of the concave part be adjusted considering the thickness of the color filter layer. In addition, in the case where a white pixel region exists in which a color filter is not formed in the device substrate, the thickness of that part is preferred to be molded thinner than the thickness of the pixel region where another color filter layer is formed.

In addition, it is preferred that an alignment marker is formed in the cover layer at the same time as molding the cover layer 110. The alignment marker is also used when bonding the device substrate formed with the support substrate 120 and organic electroluminescence device, and accuracy when aligning can be increased by forming at the same time as the concave-convex parts of the resin layer 109.

Following this, as is shown in FIG. 2C, the color filter layers 112r, 112g and 112b are formed along the surface structure of the cover layer 110. The thin region (convex region) of the cover layer 110 is a region corresponding to the pixel region in the device substrate 103 and the thin region (concave region) corresponds to the bank layer 114. The color filter layers 112r, 112g and 112b are formed so that adjacent color filter layers overlap in the thin region (concave region) of the cover layer 110. In FIG. 2C, an example of forming the red color filter layer 112r, the green color filter layer 112g and blue color filter layer 112b is shown. In this case, in the region where the red color filter layer 112r and green color filter layer 112g are adjacent, both color filter layers are stacked. This is the same for the green color filter layer 112g and blue color filter layer 112b.

In this way, since the translucency ratio of the region where a plurality of types of color filter layers with different transmission spectrums is stacked is low compared to other regions, it is possible to provide this region with a light blocking function.

Figure 3:
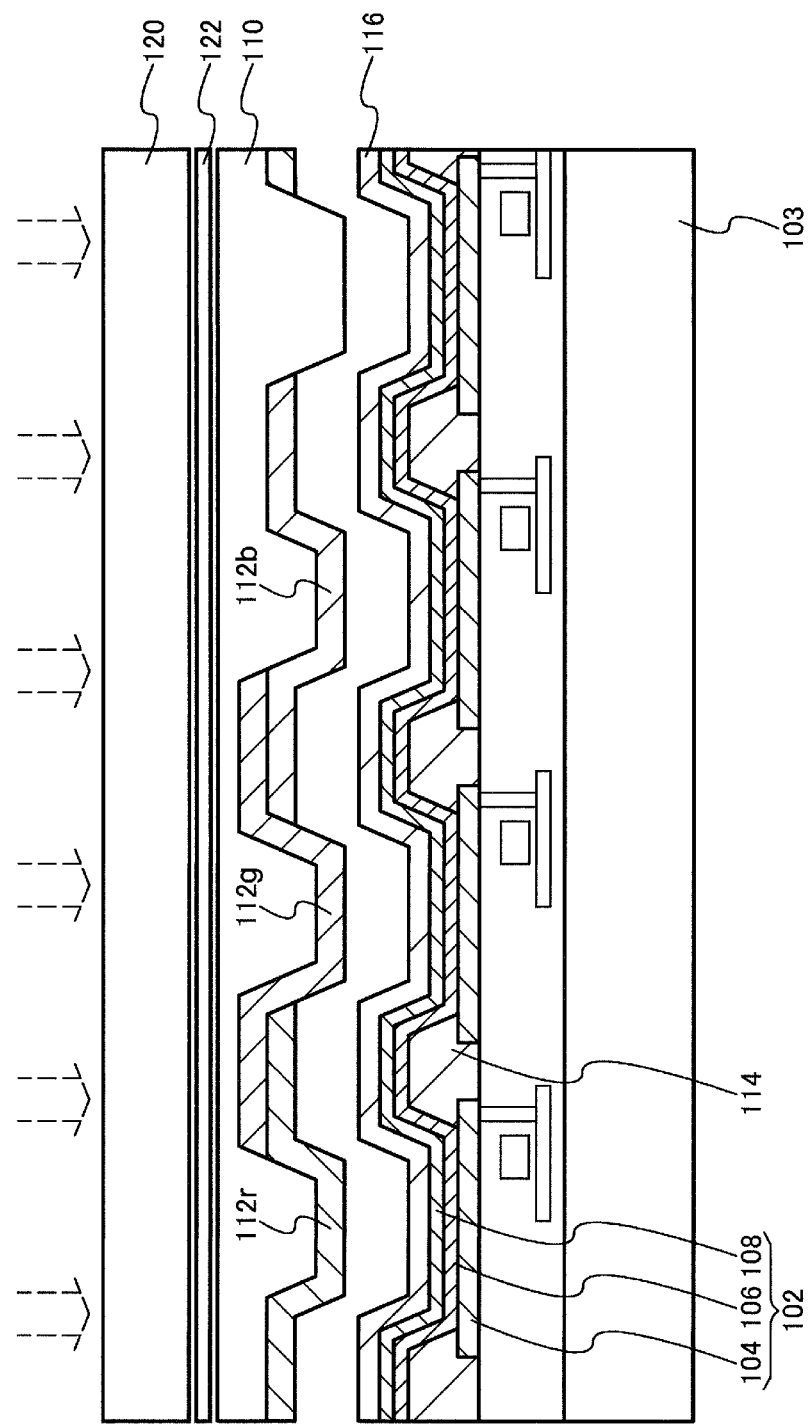
FIG. 3 is a cross-sectional diagram explaining a manufacturing process of an organic electroluminescence display device related to one embodiment of the present invention.

Next, as is shown in FIG. 3, the position of the cover layer 110, the support substrate 120 formed with the color filter layers 112r, 112g, 112b, and the device substrate formed with organic electroluminescence device 102 is adjusted, and provided so that the support substrate 120 and device substrate 103 face each other. After bonding the support substrate 120 and device substrate 103 together, the panel shown in FIG. 1 is formed by peeling the cover layer 110 from the support substrate 120. In addition, at the same as the peeling process, the cover layer 110 is sandwiched between the color filter layers 112r, 112g and 112b and attached to the device substrate 103. Furthermore, as explained while referring to FIG. 1, in the device substrate 104 the organic electroluminescence layer 106 and common electrode 108 are formed along the concave-convex surface formed by the bank layer 114 enclosing the periphery part of the pixel electrode 104. In addition, the sealing film 116 may also be formed above the common electrode 108.

As shown in FIG. 3, the color filter layers 112r, 112g and 112b of the support substrate 120 are made to face the device substrate 103 and the concave region of the cover layer 110 (the region where a plurality of color filter layers with different transmission spectrums overlap) is provided to overlap the bank layer 114. At this time, it is possible to increase alignment accuracy by using an alignment marker formed at the same time as the concave-convex parts of the cover layer 110 in the support substrate 120 in order to align the support substrate 120 and device substrate 103.

Peeling of the cover layer 110 from the support substrate 120 is performed by heating the peeling layer 122 from the surface of the support substrate 120. That is, these layers are attached above the device substrate by thermally transferring the cover layer 110 formed with the color filter layers 112r, 112g and 112b from the support substrate 120. With respect to the heating method, heating may be performed by irradiating an energy beam such as a laser beam or by conduction heating by bringing a thermal body such as a thermal head in close proximity or close contact.

The support substrate 120 is preferred to be on the thin side and is preferred to be flexible. When arranging the support substrate 120 and device substrate 103 facing each other and thermocompressing the substrates, it is possible to bring the cover layer 110 and color filter layers 112r, 112g and 112b close to the surface of the device substrate by flexing the supporting substrate 120 in line with the surface shape of the device substrate 103.

In this process, the cover layer 110 and color filter layers 112r, 112g, 112b which are transferred to the device substrate 103 from the support substrate 120 are brought close together along the concave-convex surface formed by the bank layer 114 of the device substrate 103 due to a transformation in shape by heat. In this case, it is possible support the cover layer 110 above the device substrate 103 by arranging at least the concave region of the cover layer 110 and the upper surface region of the bank layer 114 of the device substrate 103 so that they contact. Furthermore, in order to improve adhesion, a thin thermosetting resin layer (not shown in the diagram) may be provided between the sealing film 116 of the device substrate 103 and the color filter layers 112r, 112g, 112b above the cover layer 110.

In either case, it is possible to not only to form the cover layer 110 above the device substrate 103 but also simultaneously build in a color filter layer and light blocking film by forming a color filter layer above the cover layer 110 and arranging a region to overlap color filter layers with different transmission spectrums.

The organic electroluminescence display device manufactured in this way can be provided with color filter layers 112r, 112g and 112b close to the organic electroluminescence device 102 as shown in FIG. 1. In addition, it is also possible to arrange a region which functions as a light blocking film formed overlapping a color filter layer directly above the bank layer 114. As a result, according to the manufacturing method of the present embodiment, it is possible to significantly reduce light leaking to an adjacent pixel. In this way, it is possible to solve the problem of mixed colors between adjacent pixels or pixels close together and obtain an organic electroluminescence display device with excellent visual angle characteristics.

In addition, according to the present embodiment, there is no need to arrange a filler material between the device substrate 103 and cover layer 110 and it is possible to omit this. As a result, it is possible prevent bubbles from being included between the device substrate 103 and cover layer 110 and prevent the occurrence of matrix unevenness.

(Example of a Manufacturing Device, Method)

By using a flexible plastic film for the support substrate 120 which supports the cover layer 110 in the manufacturing processes shown in FIG. 2A to 2C and FIG. 3, it is possible to supply the support substrate 120 from a roll shaped winding can roll.

Figure 4:
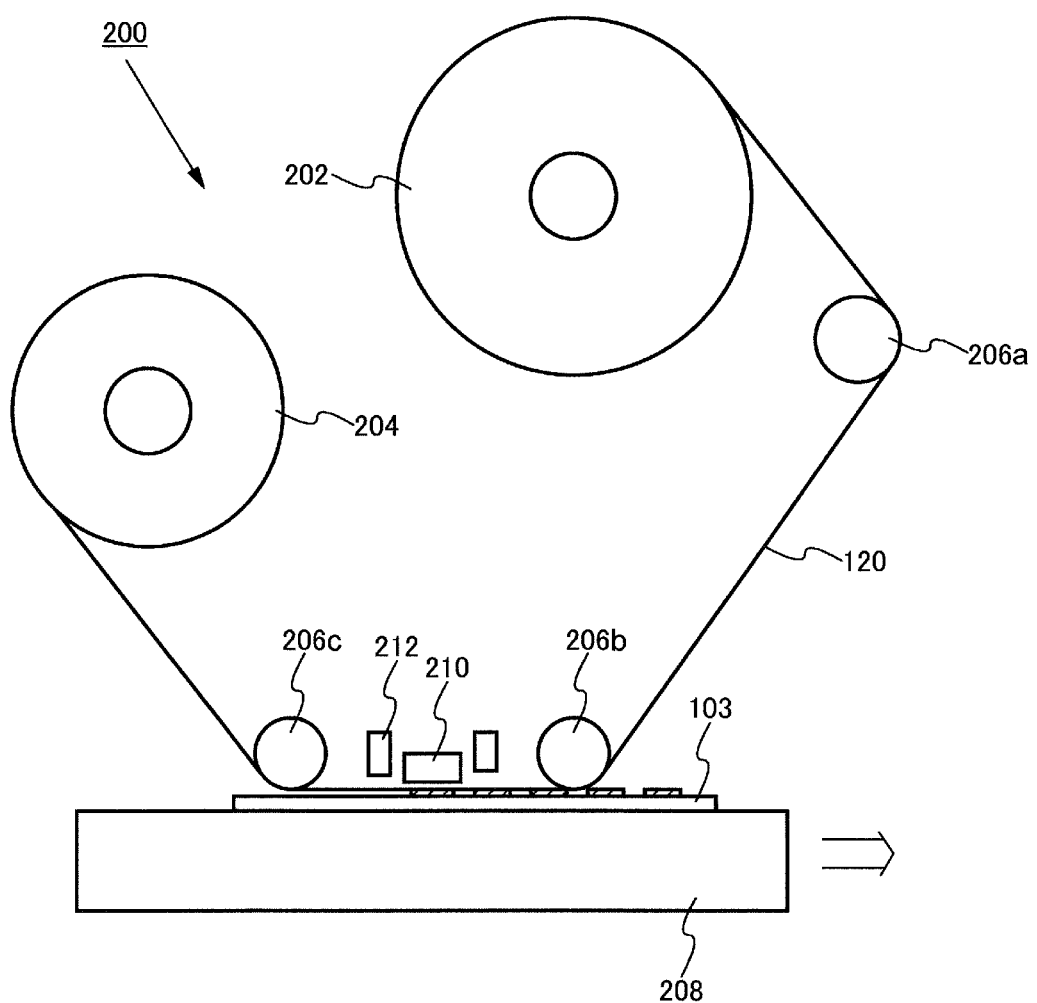
FIG. 4 is a diagram explaining the structure of a manufacturing device related to one embodiment of the present invention.

FIG. 4 shows an example of supplying the cover layer 110 and support substrate 120 formed with the color filter layer 112 and a manufacturing device 200 transferred to the device substrate 103. The manufacturing device 200 is provided with a first can roll 202 which supplies a long support substrate 120, guide rolls 206a, 206b, 206c for transporting the support substrate 120, and a second can roll 204 for winding the support substrate 120. In addition, the device includes a stage 208 which is mounted with the device substrate 103 and the support substrate 120 is stretched above the stage 208 by the guide rolls 206a, 206b, 206c. A heating part 210 for peeling the cover layer 110 from the support substrate 120 and an alignment sensor 212 for performing alignment are provided above the stage 208. It is possible to use a thermal head or laser as the heating part 210. In addition, it is possible to use a camera as the alignment sensor 212.

In the manufacturing device exemplified in FIG. 4, after the support substrate 120 sent from the first can roll 202 is extracted above the stage 208 by the guide rolls 206a, 206b, 206c, and aligned using the alignment sensor 212, the cover layer 110 is thermally transferred together with the color filter layer 112 from the support substrate 120. At this time, the first can roll 202, second can roll 204 and stage 208 send the support substrate 120 using a stepping motor and the movement of the device substrate 103 is operated in conjunction. It is preferred that a clean atmosphere is used above the stage 208 so that foreign objects are not included when transferring the cover layer 110 to the device substrate 103, for example a reduced pressure atmosphere is preferred.

Figure 5A:
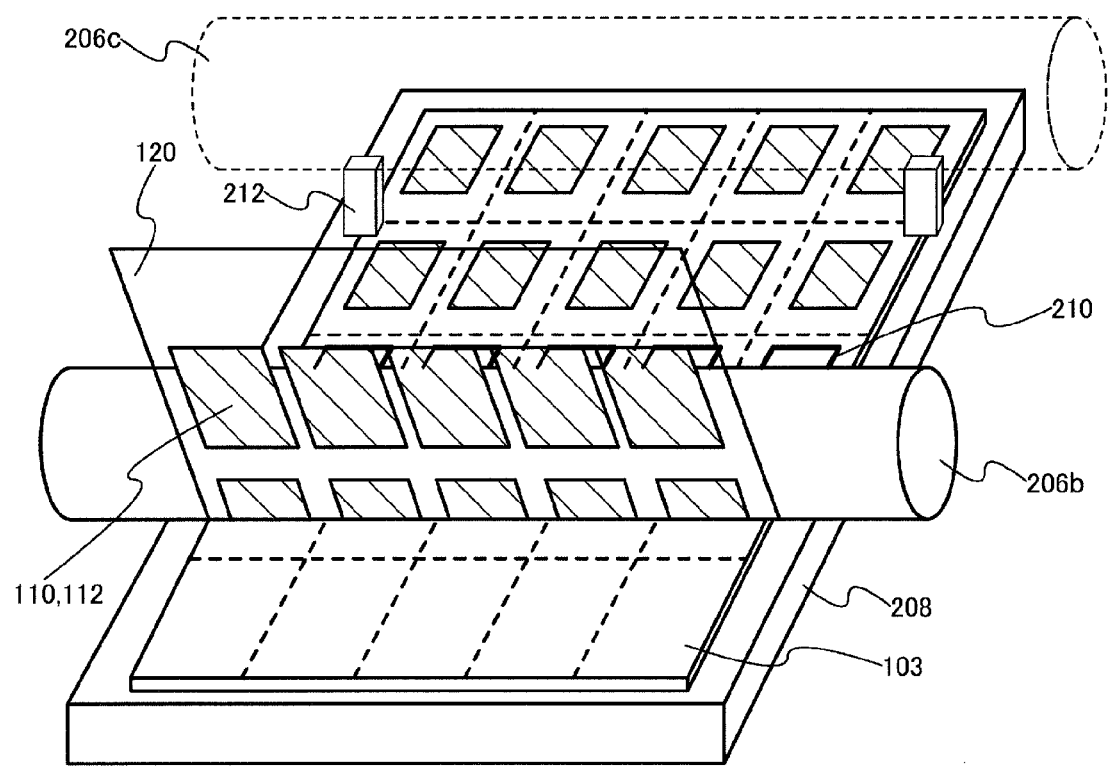
FIG. 5A is a perspective view diagram explaining the structure of a manufacturing device related to one embodiment of the present invention.
Figure 5B:
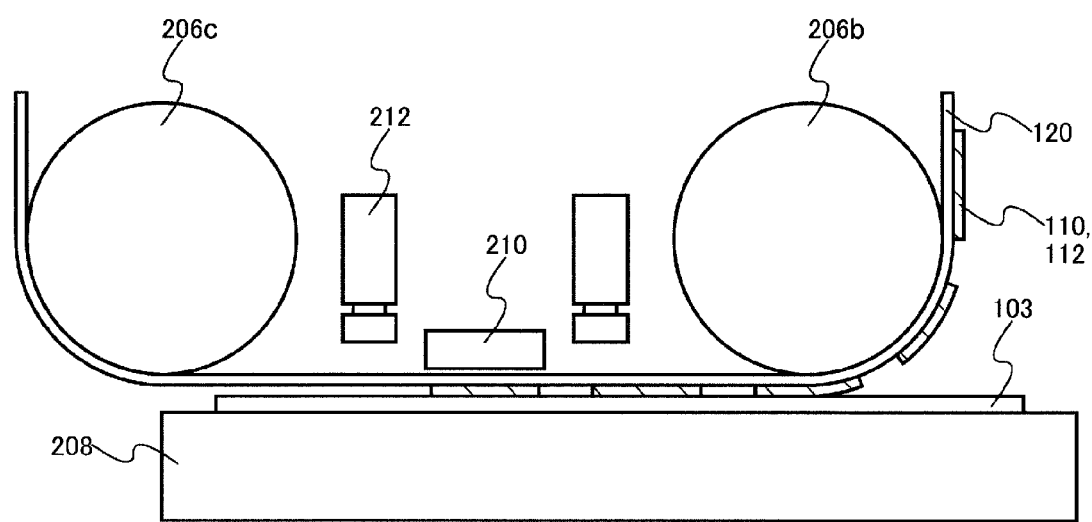
FIG. 5B is a cross-sectional diagram explaining the structure of a manufacturing device related to one embodiment of the present invention.

FIG. 5A and FIG. 5B shows the details of the stage 208 part of the manufacturing device 200. FIG. 5A shows a perspective view and FIG. 5B shows a cross-sectional view of the vicinity of the stage 208. The support substrate 120 which is long and has flexibility is stretched above the device substrate 103 mounted on the stage 208 by the guide rolls 206b and 206c. The position of the cover layer formed in the support substrate 120 and the position of the device substrate 103 are determined by detecting an alignment marker formed on each substrate using the alignment sensor 212. The heating part 212 locally heats the support substrate 120 and the cover layer 110 is transferred together with color filter layer 112 to the device substrate 103.

As is shown in FIG. 5A, it is possible to use a large substrate known as a mother glass as the device substrate 103, build a plurality of display panels within the large substrate, and also continuously manufacture a plurality of display panels in the long support substrate 120 by forming the cover layer 110 and color filter layer 112 in advance.

According to the present embodiment, it is possible to improve the production yield of an organic electroluminescence display device by using a long film with flexibility for the support substrate 120 formed with the cover layer 110 and color filter layer 112. That is, a color filter layer is not provided in an opposing substrate as in a conventional organic electroluminescence display device but it is possible to improve a visual angle by bringing the cover layer 110 and color filter layer 112 close to the device substrate 103, simplify the manufacturing process and achieve efficient production.

Second Embodiment

Figure 6:
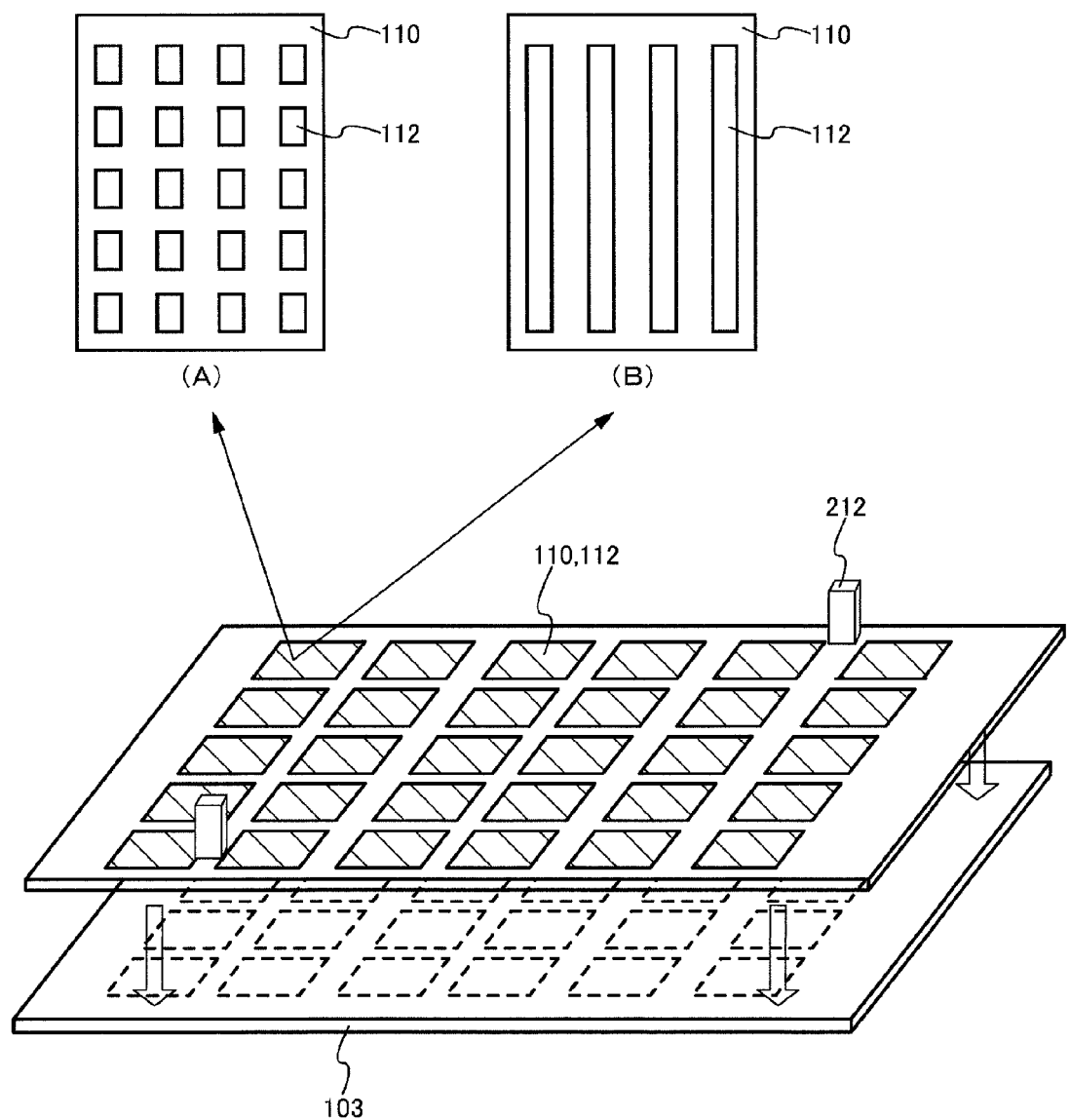
FIG. 6 is a perspective view diagram explaining a manufacturing process of an organic electroluminescence display device related to one embodiment of the present invention.

FIG. 6 shows a situation in which the cover layer 110 and color filter layer 112 are transferred in alignment with the support substrate 120 having a roughly similar size as a large substrate as the device substrate 103 in the case where a plurality of display panels are built within the large substrate know as a mother glass.

In FIG. 6, alignment is performed using alignment markers formed on the support substrate 120 and device substrate 103 and it is possible to thermally transfer the cover layer 110 and color filter layer 112 from the support substrate 120 on one go with respect to the plurality of display panels built in to the device substrate 103. It is possible to use a relatively thin plastic substrate or glass substrate as the support substrate 120 formed with the cover layer 110 and color filter layer 112.

For the thermal transfer process, either a method for heating the same surface of the support substrate 120 or a method for partially heating the support substrate 120 may be applied. For example, the same surface of the support substrate 120 may be heated by several heating processes using a small thermal head as the heating object and thermal transfer may also be performed in one go using a large heating object.

Figure 7:
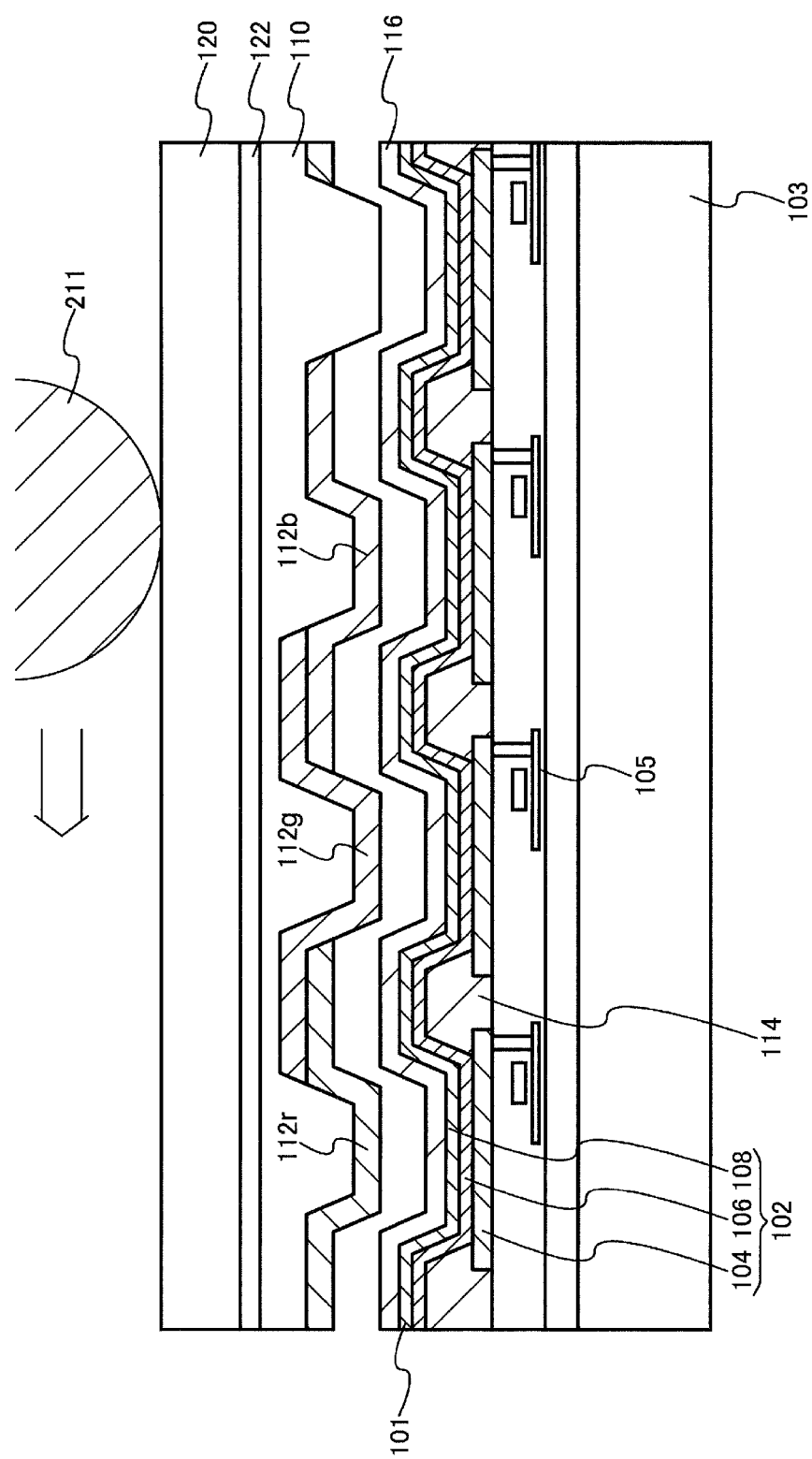
FIG. 7 is a cross-sectional diagram explaining a manufacturing process of an organic electroluminescence display device related to one embodiment of the present invention.

In addition, as is shown in FIG. 7, a thermal control function may be provided in the roller 211 and thermal transfer may be performed by pushing the roller 211 against the support substrate 120 while rotating. FIG. 7 shows an aspect in which the support substrate 120 formed with the color filter layers 112r, 112g, 112b and the cover layer 110 is aligned with the device substrate 103 and the same surface of the substrates are processed while applying pressure using the roller 211 which is the heating object from the rear surface of the support substrate 120. It is possible securely bond the color filter layers 112r, 112g, 112b and cover layer 110 to the device substrate 103 side by applying pressure to the support substrate 120 using the roller 211.

In this way, in the case of corresponding the device substrate 103 and the support substrate 120 one by one, it is possible to use a hard substrate for one and a flexible substrate for the other. For example, if a glass substrate is used as the support substrate formed with the cover layer 110 and the color filter layer 112, it is possible to use a flexible substrate for the device substrate manufactured by the display device. In this case, because it is also possible to accurately transfer the cover layer 112 to the device substrate 103, it is possible to easily manufacture a display device with flexibility known as a sheet display.

Furthermore, as shown in FIG. 6, it is possible to use a dot shaped product provided with a color filter layer for each pixel or a striped shaped product provided continuously across a plurality of pixels. In either case, it is possible to overlap color filter layers with different transmission spectrums and obtain arrange a light blocking region in a boundary region of adjacent pixels.

Modified Example 1

In the case where a color filter layer is transferred to the device substrate 103, the color filter layer may be transferred not at the same time as the cover layer but before the cover layer. In this case, it is possible to use a support substrate formed with a red color filter layer, green color filter layer and blue color filter layer separate from a support substrate formed with a cover layer and transfer these color filter layers to the device substrate. In addition, a color filter layer may be transferred separately for each color.

Figure 8:
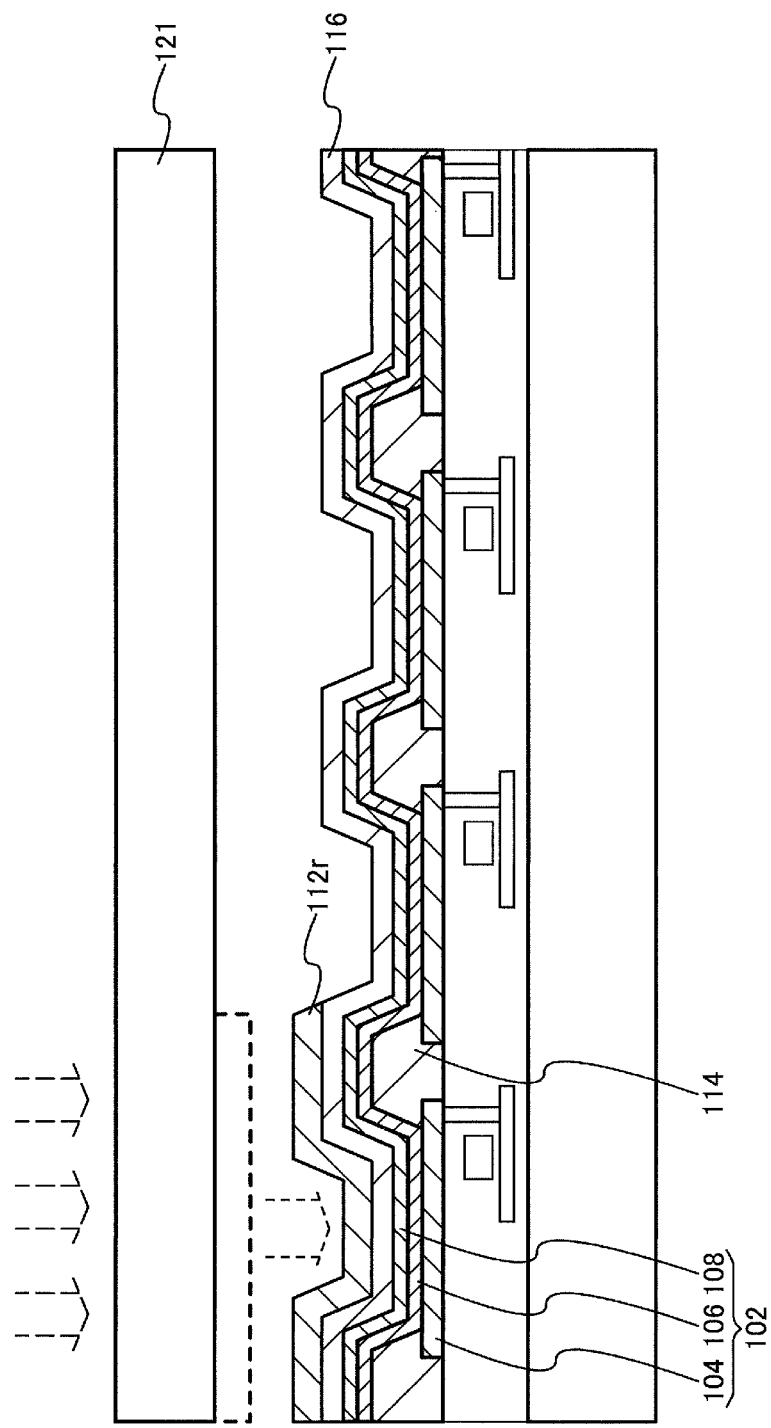
FIG. 8 is a cross-sectional diagram explaining a manufacturing process of an organic electroluminescence display device related to one embodiment of the present invention.

FIG. 8 shows an example of transferring a color filter layer for each color from a support substrate 121 of a color filter layer to the device substrate 103 and shows an aspect of thermally transferring a red color filter layer 112r as one example. The color filter layer is transferred in the following sequence; the blue color filter layer is transferred after the red color filter layer and then the green color filter layer. Furthermore, the transfer of each color filter layer is not limited to this order and it is possible to form a color filter layer of each color in an arbitrary order.

In FIG. 8, it is preferred that the red color filter layer 112r is formed overlapping the upper surface part of the bank layer 114. It is possible to stack different color filter layers above the bank layer 114 by forming the green color filter layer 112g to contact the upper part of the bank layer 114 after the red color filter layer 112r.

Figure 9:
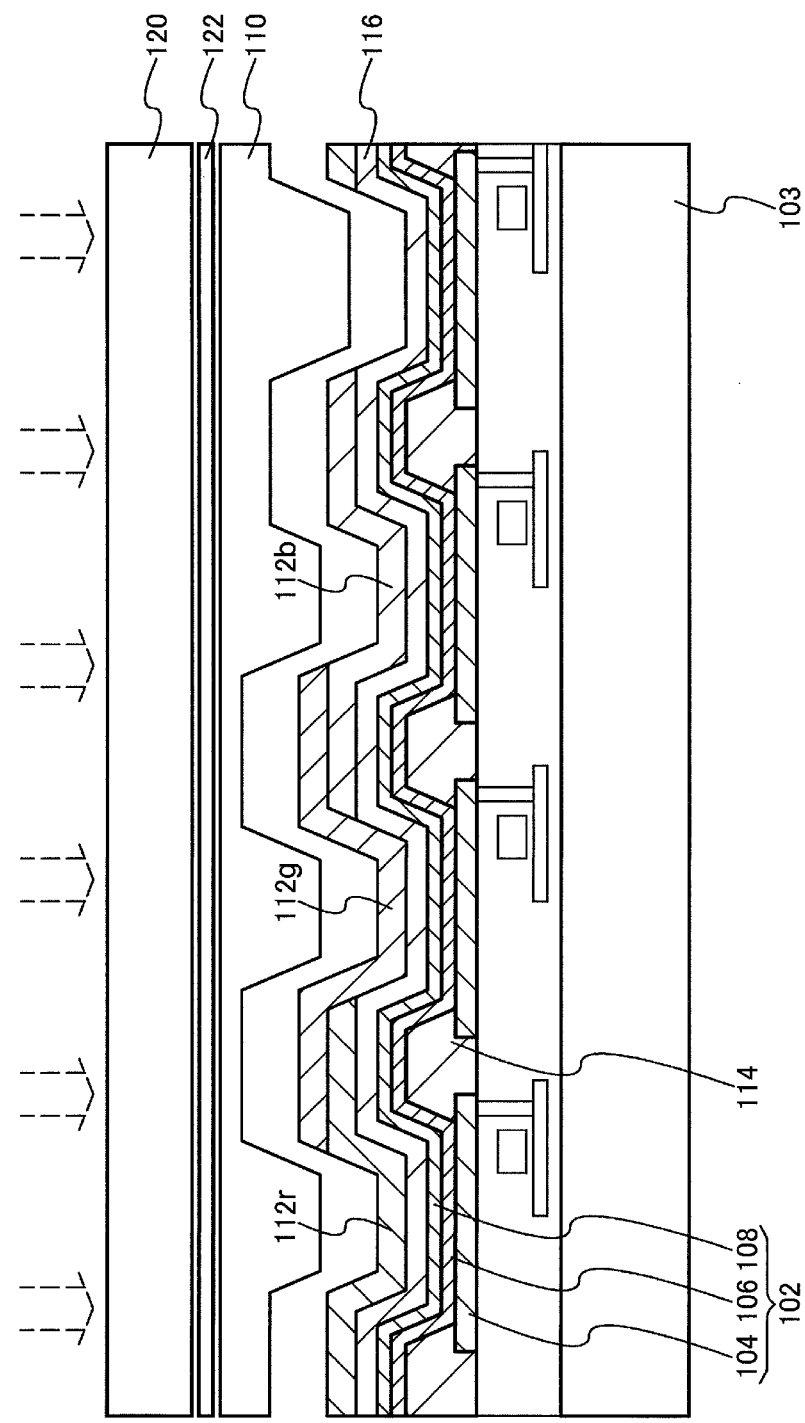
FIG. 9 is a cross-sectional diagram explaining a manufacturing process of an organic electroluminescence display device related to one embodiment of the present invention.

FIG. 9 shows a stage where the cover layer 110 is peeled from the support substrate 120 in a state where the color filter layers 112r, 112g and 112b are formed in the device substrate 103. When the cover layer 110 is peeled from the support substrate 120, heating is performed in pressed state to the device substrate 103, the color filter layers 112r, 112g and 112b change shape matching the concave-convex surface of the bank layer 114 and it is possible to bond to the concave-convex surface together with cover layer 110.

In this way, it is possible to provide a cover filter layer in close proximity to an organic electroluminescence device even when forming a color filter layer and cover layer separately above a device substrate. In this case, because a color filter layer of each color may be formed in advance in a support substrate respectively, it is possible to improve yield and reduce manufacturing costs compared to forming a color filter layer of all colors.

Modified Example 2

Figure 10:
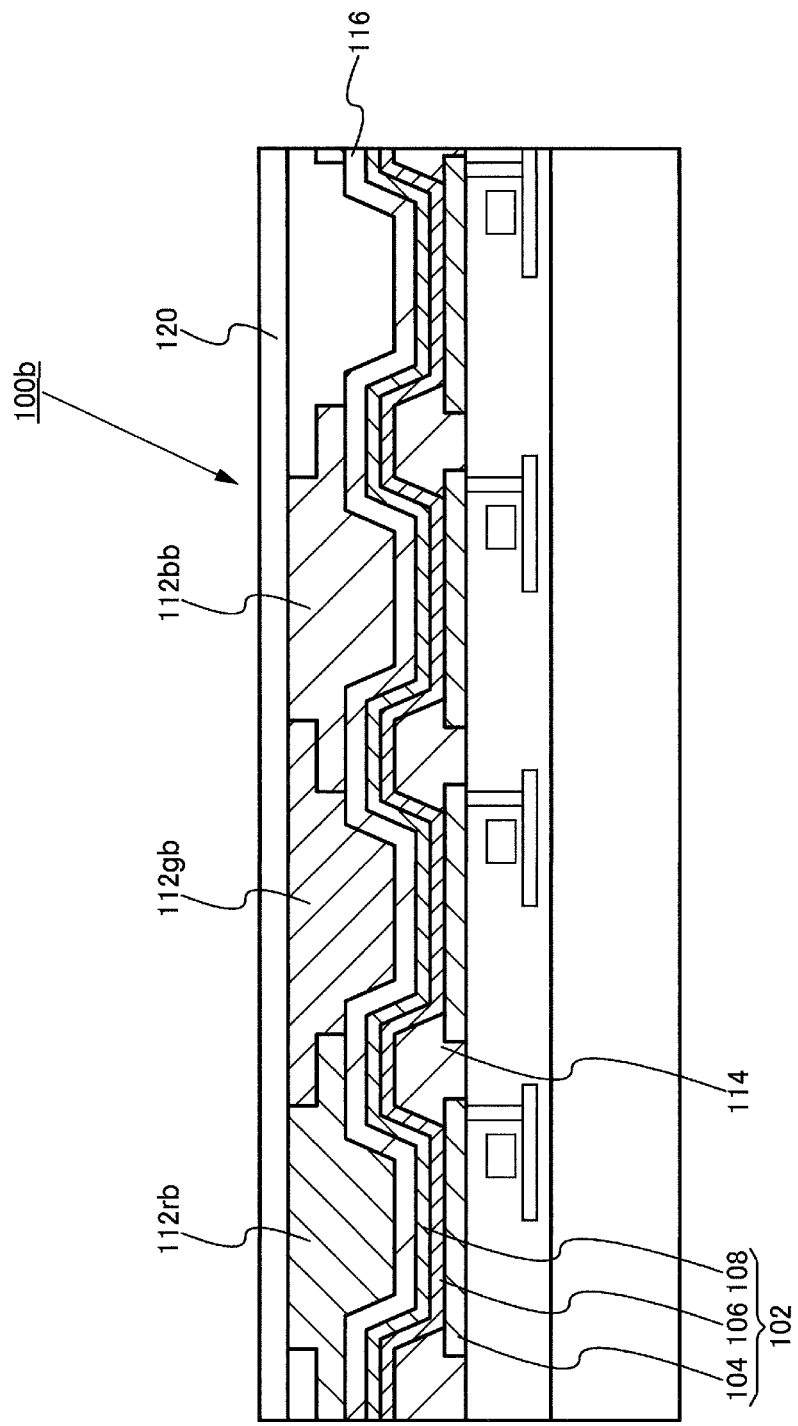
FIG. 10 is a cross-sectional diagram showing the structure of an organic electroluminescence display device related to one embodiment of the present invention.

In an organic electroluminescence display device, in the case where a color filter layer is provided in close proximity to an organic electroluminescence device, a concave region is not formed in a cover layer as shown in FIG. 1 but a color filter layer is formed so that a concave-convex surface using the bank layer 114 and the surface of the color filter layer are aligned. FIG. 10 shows an example of forming a color filter layer and bringing the layer in close proximity to an organic electroluminescence device.

In FIG. 10, a red (R) color filter layer 112rb, a green (G) color filter layer 112gb and blue (B) color filter layer 112bb are provided matching the shape of the concave-convex surface using the bank layer 114 so as to be in close proximity of the organic electroluminescence device 102. That is, a color filter layer is filled in the concave part of the concave-convex part formed by the bank layer 114. These color filter layers are provided so that adjacent color filter layers overlap in the upper part of the bank layer 114. The region where the adjacent color filter layers are overlapping functions as a light blocking film. A cover layer may be provided in the upper part of the color filter layers 112rb, 112gb and 112bb.

Since the organic electroluminescence device 102 and color filter layers 112rb, 112gb and 112bb are also provided in close proximity in the organic electroluminescence display device 100b shown in FIG. 10, it is possible obtain the same effects as the organic electroluminescence display device shown in the first embodiment.

What is claimed is:

1. An organic electroluminescence display device comprising:
    a substrate provided with a plurality of pixels;
    a plurality of pixel electrodes formed over the substrate, each of the pixel electrodes being formed in each of the pixels;
    a bank layer located in a gap part between the plurality of pixels and exposing the pixel electrode;
    a light emitting layer located on a side of the pixel electrode, the side being opposite to the substrate;
    a common electrode located on a side of the light emitting layer, and provided over the plurality of pixels and the bank layer, the side being opposite to the substrate;
    a color filter layer located on a side of the common electrode, and provided over the bank layer and one of the plurality of pixels, the side being opposite to the substrate; and
    a cover layer located on a side of the color filter and provided over the plurality of pixels and the bank layer, the side being opposite to the substrate,
    wherein each of the plurality of pixel electrodes includes an exposure area exposed by the bank layer, and
    a surface of the color filter layer has a convex shape protruding towards the substrate at a position facing the exposure area, the surface facing the common electrode.

2. The organic electroluminescence display device according to claim 1, wherein the light emitting layer is provided over the plurality of pixels and the bank layer.

3. The organic electroluminescence display device according to claim 1, wherein the plurality of pixels include a first pixel and a second pixel adjacent to the first pixel,
    the color filter layer includes a first color filter layer and a second color filter layer;
    the first pixel is provided with the first color filter layer;
    the second pixel is provided with the second color filter layer; and
    the first color filter layer and the second color filter layer overlap at an upper surface part of the bank layer positioned in a gap part between the first pixel and the second pixel.

4. The organic electroluminescence display device according to claim 3, wherein the cover layer includes a concave part dented towards an opposite side of the substrate at a position facing the upper surface part.

5. The organic electroluminescence display device according to claim 3, wherein a third pixel is further provided adjacent to the second pixel;
    the second color filter layer is provided not to overlap a color filter layer different to the second color filter layer at an upper surface part of the bank layer positioned in a gap part between the second pixel and the third pixel;
    the bank layer positioned in the gap part between the first pixel and the second pixel includes a first height;

the bank layer located in the gap part between the second pixel and the third pixel includes a second height; and the second height is larger than the first height.

6. The organic electroluminescence display device according to claim 1, wherein the color filter layer includes a first area facing an upper surface part of the bank layer, a second area facing the pixel electrode, and a third area facing a side surface part of the bank layer and linking the first area and second area, and the second area is nearer to the substrate than the first area.

7. The organic electroluminescence display device according to claim 1, wherein a sealing film is provided between the common electrode and the color filter layer.

8. The organic electroluminescence display device according to claim 7, wherein the sealing layer is formed in the silicon nitride.

9. The organic electroluminescence display device according to claim 1, wherein the cover layer is formed using an organic resin material.

10. The organic electroluminescence display device according to claim 1, wherein the cover layer includes a convex part protruding towards the substrate at a position facing the exposure area.

11. The organic electroluminescence display device according to claim 1, wherein the color filter layer includes a convex part having the convex shape.

12. The organic electroluminescence display device according to claim 1, wherein the bank layer and the exposure area form a concave-convex shape, the common electrode includes a concave part formed in the concave-convex shape at a position facing the exposure area, and the color filter layer fills the concave part.

13. An organic electroluminescence display device comprising:

a substrate provided with a plurality of pixels;

a plurality of pixel electrodes formed over the substrate, each of the pixel electrodes being formed in each of the pixels;

a bank layer located in a gap part between the plurality of pixels and exposing the pixel electrode;

a light emitting layer located on a side of the pixel electrode, the side being opposite to the substrate;

a common electrode located on a side of the light emitting layer, and provided over the plurality of pixels and the bank layer, the side being opposite to the substrate;

a color filter layer located on a side of the common electrode, and provided over the bank layer and one of the plurality of pixels, the side being opposite to the substrate;

wherein each of the plurality of pixel electrodes includes an exposure area exposed by the bank layer; and a surface of the color filter layer has a convex shape protruding towards the substrate at a position facing the exposure area, the surface facing the common electrode, and the color filter layer includes a convex part having the convex shape, wherein the bank layer and the exposure area form a concave-convex shape, the common electrode includes a concave part formed in the concave-convex shape at a position facing the exposure area, and the color filter layer fills the concave part.

14. The organic electroluminescence display device according to claim 13, wherein the plurality of pixels include a first pixel and a second pixel adjacent to the first pixel, the color filter layer includes a first color filter layer and a second color filter layer;

the first pixel is provided with the first color filter layer;

the second pixel is provided with the second color filter layer; and the first color filter layer and the second color filter layer overlap at an upper surface part of the bank layer positioned in a gap part between the first pixel and the second pixel.

15. The organic electroluminescence display device according to claim 13 further comprising:

a cover layer positioned on an opposite side to the substrate of the color filter layer and is provided over the plurality of pixels and the bank layer.

* * * * *